United States Patent
Kozaru

[11] Patent Number: 6,067,597
[45] Date of Patent: May 23, 2000

[54] WORD CONFIGURATION PROGRAMMABLE SEMICONDUCTOR MEMORY WITH MULTIPLE WORD CONFIGURATION PROGRAMMING MODE

[75] Inventor: Kunihiko Kozaru, Hyogo, Japan

[73] Assignee: Mitsubishi Denki Kabushiki Kaisha, Tokyo, Japan

[21] Appl. No.: 08/780,081

[22] Filed: Dec. 23, 1996

[30] Foreign Application Priority Data

Jan. 9, 1996 [JP] Japan ..................................... 8-001247

[51] Int. Cl.$^7$ ................................ G06F 12/00; G11C 7/00
[52] U.S. Cl. .............. 711/100; 365/189.01; 365/189.08; 365/238.5
[58] Field of Search ..................................... 711/100, 118, 711/154; 365/201, 220, 238.5, 189.01, 189.08

[56] References Cited

U.S. PATENT DOCUMENTS

| | | | |
|---|---|---|---|
| 4,876,669 | 10/1989 | Yamamoto et al. ................ | 365/189.01 |
| 5,295,098 | 3/1994 | Kohno .................................. | 365/189.05 |
| 5,384,736 | 1/1995 | Jung et al. .......................... | 365/189.09 |
| 5,384,741 | 1/1995 | Haraguchi ............................... | 365/201 |
| 5,392,249 | 2/1995 | Kan ........................................ | 365/203 |
| 5,428,575 | 6/1995 | Fudeyasa .............................. | 365/201 |
| 5,450,354 | 9/1995 | Sawada et al. ......................... | 365/185 |
| 5,471,432 | 11/1995 | Makihara ............................. | 365/233.5 |
| 5,519,657 | 5/1996 | Arimoto ................................ | 365/200 |
| 5,519,659 | 5/1996 | Tamida et al. .......................... | 365/201 |
| 5,574,691 | 11/1996 | Tamida et al. .......................... | 365/201 |
| 5,602,778 | 2/1997 | Futatsuya ........................... | 365/185.09 |
| 5,608,682 | 3/1997 | Jinbo et al. ............................. | 365/222 |
| 5,612,917 | 3/1997 | Kozuru et al. ......................... | 365/200 |
| 5,654,924 | 8/1997 | Suzuki .............................. | 365/189.05 |
| 5,666,317 | 9/1997 | Tamida et al. .......................... | 365/201 |
| 5,706,233 | 1/1998 | Ooishi .................................... | 365/201 |

*Primary Examiner*—Tuan V. Thai
*Attorney, Agent, or Firm*—McDermott, Will & Emery

[57] ABSTRACT

A semiconductor memory device includes a programming mode detecting circuit for detecting a programming mode, a word configuration programming circuit which can be programmed with a word configuration in the programming mode, and a word configuration selecting circuit for selecting a word configuration based on the programmed word configuration. Therefore, in the semiconductor memory device, a word configuration can be set even after molding.

5 Claims, 11 Drawing Sheets

WORD CONFIGURATION PROGRAMMABLE SEMICONDUCTOR MEMORY WITH MULTIPLE WORD CONFIGURATION PROGRAMMING MODE

BACKGROUND OF THE INVENTION

1. Field of the Invention

The present invention relates generally to semiconductor devices, and more particularly, to a semiconductor memory device whose word configuration can be changed after molding.

2. Description of the Background Art

In semiconductor memory devices such as SRAM, the word configuration of multi-bit memories are changed by means of aluminum master slice approach or bonding option. The aluminum master slice approach requires change of aluminum masks, resulting in high cost, while the masks do not have to be changed by bonding option.

Figure 11:
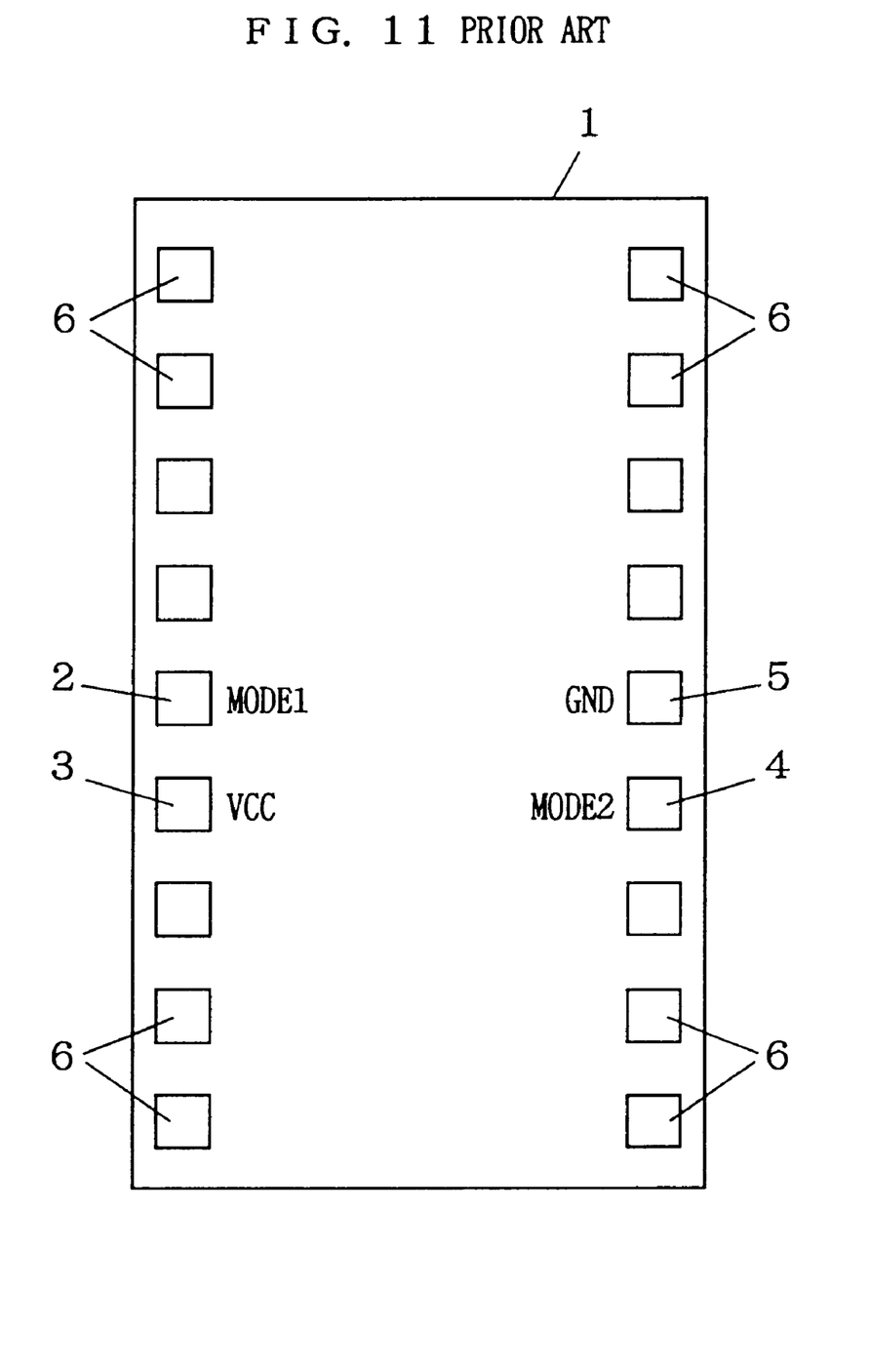
FIG. 11 is a plan view showing the structure of a conventional semiconductor memory device whose word configuration is set by means of bonding option.

FIG. 11 is a plan view showing an example of a conventional semiconductor memory device whose word configuration can be changed by bonding option. As shown in FIG. 11, a plurality of pads 2 to 6 are formed on a semiconductor chip 1. Pad 2 for setting a word configuration is formed next to pad 3 for power supply, and another pad 4 for setting a word configuration is formed next to pad 5 for grounding.

The following Table 1 represents word configuration set based on the states of pads 2 and 4, MODE 1 and MODE 2.

TABLE 1

| Word Configuration | ×8 | ×4 | ×1 |
|---|---|---|---|
| MODE 1 | HiZ | HiZ | H |
| MODE 2 | HiZ | L | HiZ |

When not bonded, both pads 2 and 4 attain a high impedance state (HiZ) as in Table 1, and therefore ×8 configuration is selected. When pad 2 is not bonded and pad 4 is bonded with pad 5, pad 2 attains a high impedance state, pad 4 attains an L (logical low) level (ground voltage GND) state, and therefore the word configuration is changed to ×4 configuration. When pad 2 and pad 3 are bonded and pad 4 is not bonded, pad 2 attains an H (logical high) level (power supply voltage VCC) state as in Table 1, pad 4 attains a high impedance state, and therefore the word configuration is changed to ×1 configuration.

Such bonding option allows the word configuration to be changed at the time of wire bonding, the wafer test can be conducted with a multi-bit configuration (×8 configuration herein). Therefore, time required for such test is shorter than the aluminum master slice approach, and cost for the test is advantageously lower.

The bonding option, however, requires additional pads 2 and 4 for setting the word configuration, and the area penalty becomes large. Furthermore, the word configuration set at the time of wire bonding can not be changed after molding.

SUMMARY OF THE INVENTION

It is an object of the invention to provide a smaller size semiconductor device.

Another object of the invention is to provide a semiconductor memory device whose word configuration can be changed after molding.

According to the present invention, a semiconductor memory device includes a memory cell array, an input/output system, a word configuration programming circuit, a word configuration selecting circuit, and a programming mode detecting circuit. The input/output system input/outputs data to/from the memory cell array. The word configuration programming circuit can be programmed with a word configuration. The word configuration selecting circuit selects the number of bits to be input/output at a time by the input/output system in response to one address signal based on a word configuration program in the word configuration programming circuit. The programming mode detecting circuit detects a programming mode for programming a word configuration in the word configuration programming circuit and produces a programming signal. A word configuration is programmed in the word configuration programming circuit in response to the programming signal.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be specifically described with reference to the accompanying drawings. Note that the same reference numerals and characters represent the same or corresponding portions in the drawings.

First Embodiment

Figure 1:
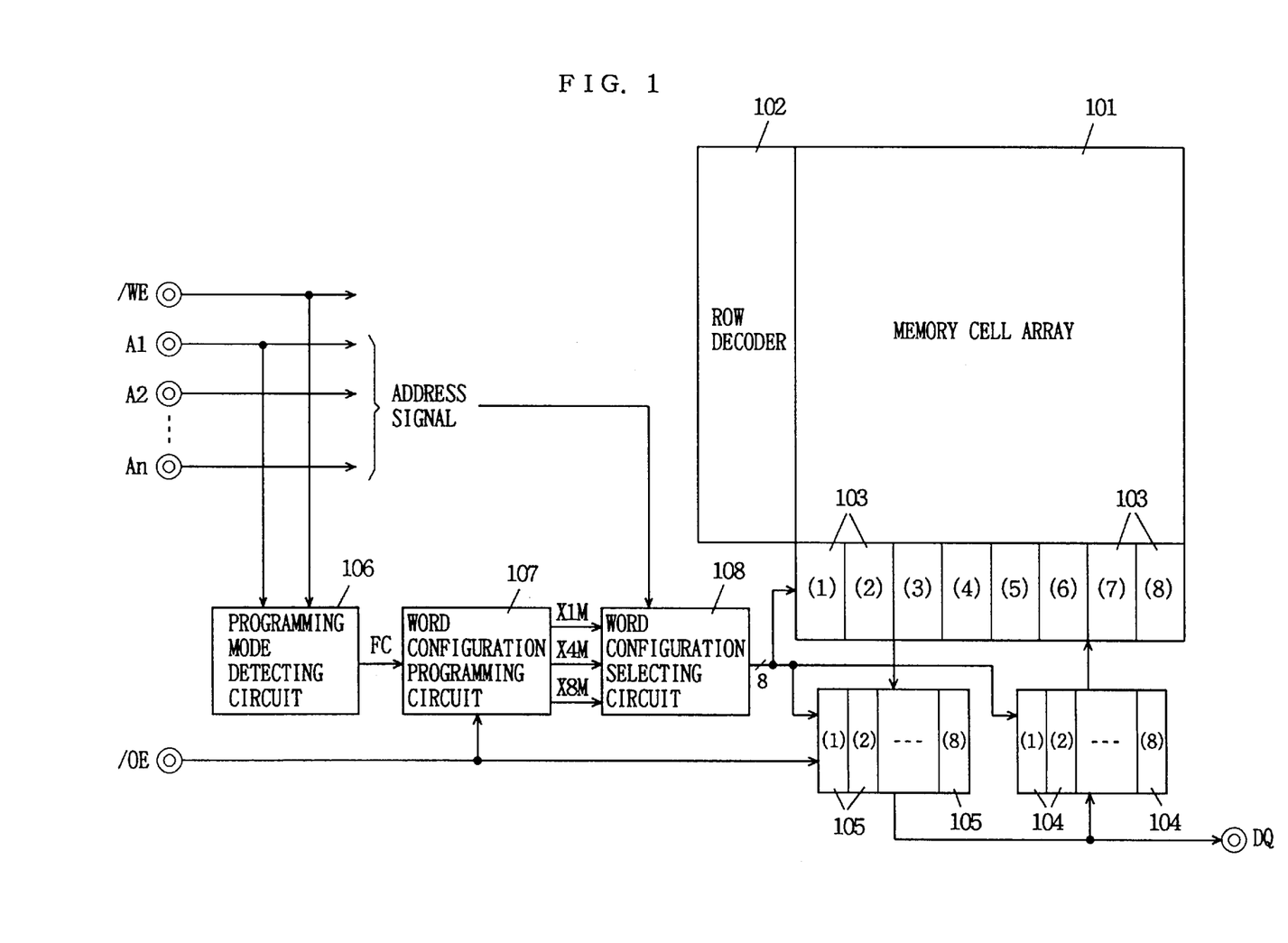
FIG. 1 is a block diagram showing the over all structure of a semiconductor memory device according to a first embodiment of the invention.

FIG. 1 is a block diagram, showing the over all structure of a semiconductor memory device according to a first embodiment of the invention. Referring to FIG. 1, the semiconductor memory device (such as SRAM and DRAM) includes a memory cell array 101, a row decoder 102, 8 sense amplifier/write drivers 103, 8 data input buffers 104, and 8 data output buffers 105. Memory cell array 101 includes a plurality of memories arranged in rows and columns, a plurality of word lines arranged in rows, and a plurality of bit line pairs arranged in columns. Row decoder 102 selectively activates a word line in response to a row address signal. Sense amplifier/write drivers 103 each amplify 1 bit data read out from a memory cell or write externally applied one bit data in a memory cell. Data input buffers 104 each input externally applied data DQ in a corresponding sense amplifier/write driver 103. Data output buffers 105 each output data from a corresponding sense amplifier/write driver 103.

The semiconductor memory device further includes a programming mode detecting circuit 106, a word configuration programming circuit 107, and a word configuration selecting circuit 108. Programming mode detecting circuit 106 detects a programming mode and produces a programming signal FC. Word configuration programming circuit 107 is programmed with a word configuration in response to programming signal FC from programming mode detecting circuit 106. Programming selecting circuit 108 selects the number of bits of data to be input at a time by data input buffer 104 in response to one address signal based on the word configuration programmed in word configuration programming circuit 107, and selects the number of bits of data to be output at a time by output buffer 105 in response to one address signal.

More specifically, when ×1 configuration is programmed in word configuration programming circuit 107, word configuration selecting circuit 108 activates one sense amplifier/write driver 103, one data input buffer 104, and one data output buffer 105. When ×4 configuration is programmed in word configuration programming circuit 107, word configuration selecting circuit 108 activates 4 sense amplifier/write drivers 103 and 4 data input buffers 104, and 4 data output buffers 105. When ×8 configuration is programmed in word configuration programming circuit 107, word configuration selecting circuit 108 activates all the sense amplifier/write drivers 103, all the data input buffers 104, and all the data output buffers 105.

Figure 2:
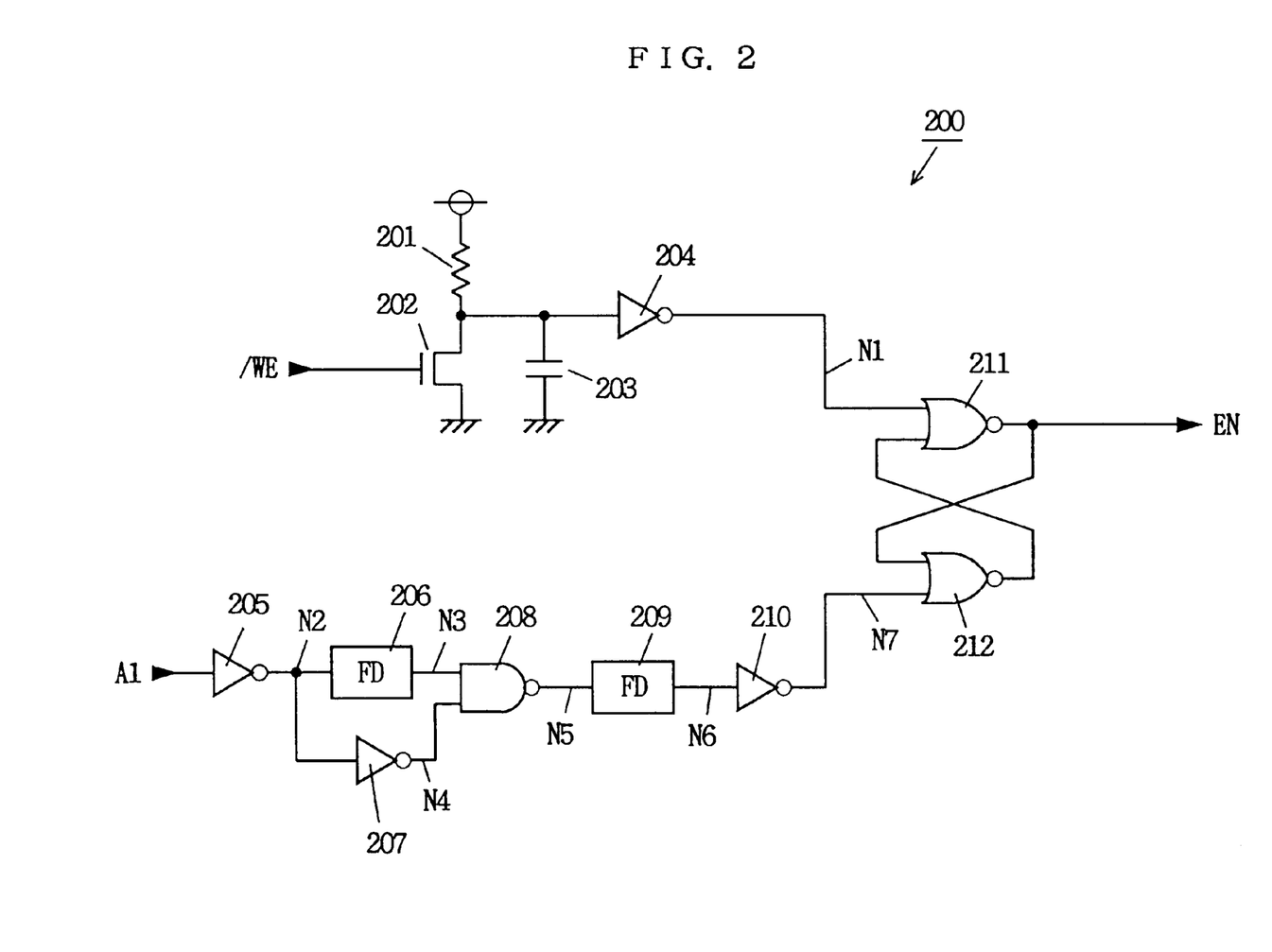
FIG. 2 is a circuit diagram showing the structure of a timing detecting circuit included in a programming mode detecting circuit in FIG. 1.
Figure 3:
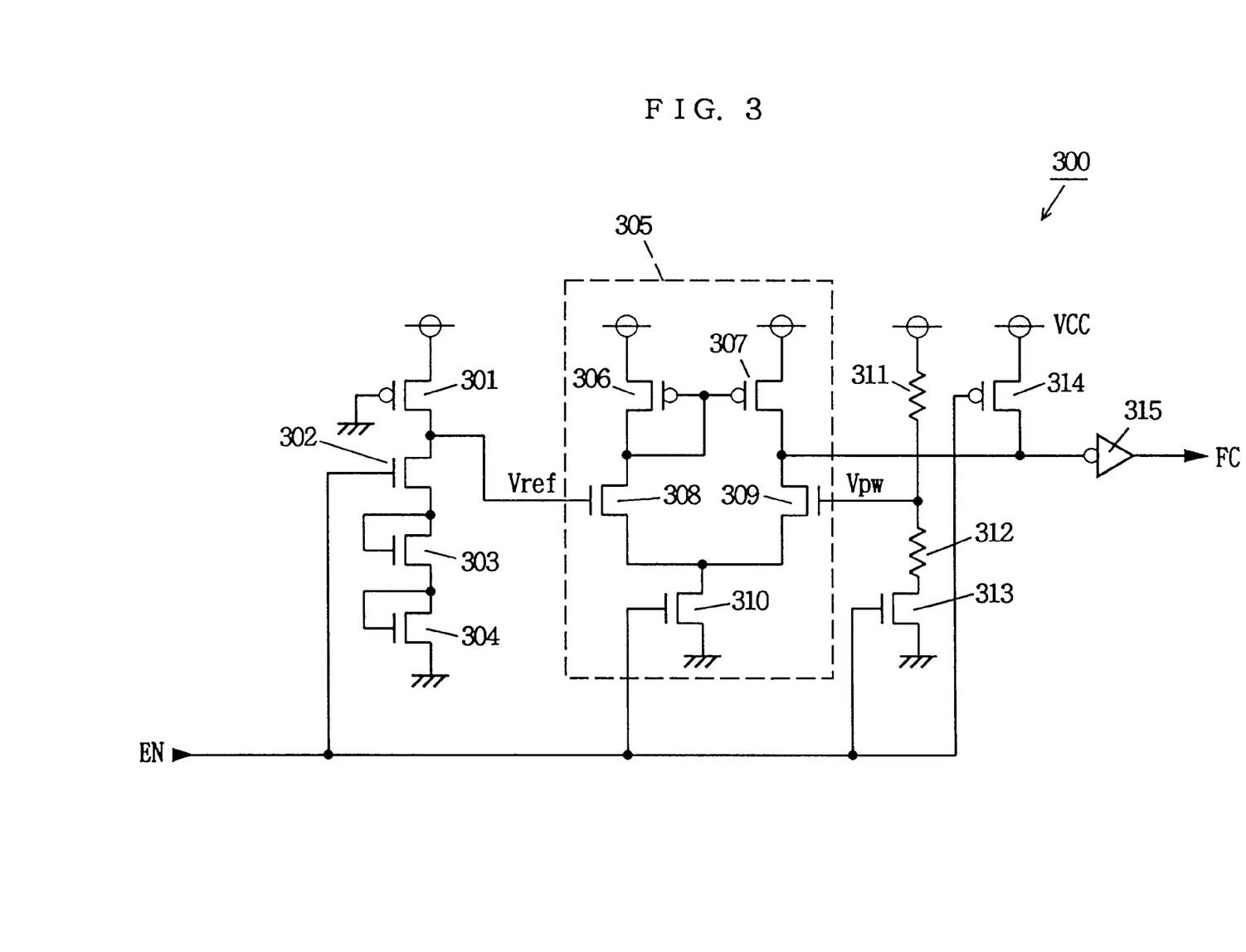
FIG. 3 is a circuit diagram showing the structure of a voltage comparison circuit included in the programming mode detecting circuit in FIG. 1.

Programming mode detecting circuit 106 includes a timing detecting circuit 200 shown in FIG. 2, and a voltage comparison circuit 300 shown in FIG. 3. Timing detecting circuit 200 produces an activating signal EN when a write enable signal /WE and the first bit A1 of an address signal are provided in a predetermined timing. Voltage comparison circuit 300 is activated in response to activation signal EN from timing detecting circuit 200, and produces a programming signal FC if provided power supply voltage Vcc is higher than a predetermined voltage.

Referring to FIG. 2, timing detecting circuit 200 includes a resistor element 201 having a high resistance, an N channel MOS transistor 202 turned on/off in response to write enable signal /WE, a capacitor 203, and an inverter 204. Timing detecting circuit 200 further includes an inverter 205 receiving the first bit A1 of an address signal, a fall delay (FD) circuit 206 for delaying only the fall of an output signal from inverter 205, and an inverter 207 receiving an output signal from inverter 205, an NAND circuit 208 receiving output signals from fall delay circuit 206 and inverter 207, a fall delay circuit 209 for delaying only the fall of an output signal from NAND circuit 208, and an inverter 210 receiving an output signal from fall delay circuit 209. Timing detecting circuit 200 further includes an R-S flipflop circuit formed of NOR circuits 211 and 212. An output signal from inverter 204 is applied to NOR circuit 211 as a reset signal. An output signal from inverter 210 is applied to NOR circuit 212 as a set signal. NOR circuit 211 outputs an activation signal EN.

Referring to FIG. 3, voltage comparison circuit 300 includes a differential sense amplifier 305 which compares a power supply detecting voltage Vpw in proportion to power supply voltage Vcc with a fixed reference voltage Vref irrespectively of power supply voltage Vcc. Differential sense amplifier 305 is activated in response to activation signal EN from timing detecting circuit 200. Voltage comparison circuit 300 further includes a P channel MOS transistor 301 functioning as a resistor, an N channel MOS transistor 302 turned on in response to an H level activation signal EN, and diode-connected N channel MOS transistors 303 and 304. As a result, the fixed reference voltage Vref is generated in response to application of H level activation signal EN. Voltage comparison circuit 300 further includes resistor elements 311 and 312 connected in series, and an N channel MOS transistor 313 turned on in response to H level activation signal EN. As a result, power supply detecting voltage Vpw in proportion to power supply voltage Vcc is generated in response to application of H level activation signal EN. The voltage comparison circuit 300 further includes a P channel MOS transistor 314 turned on in response to an L level activation signal EN, and an inverter 315 receiving an output signal from differential sense amplifier 305. Inverter 315 generates a programming signal FC.

Figure 4:
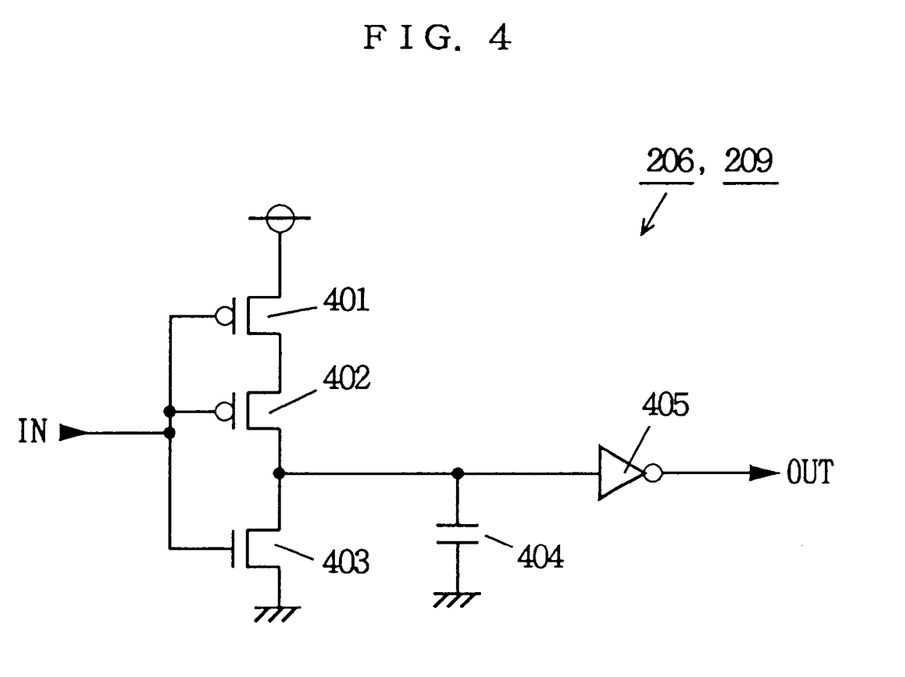
FIG. 4 is a circuit diagram showing the specific structure of a fall delay circuit in FIG. 2.

FIG. 4 is a circuit diagram showing an example of fall delay circuit 206 or 209 shown in FIG. 2. Referring to FIG. 4, fall delay circuit 206 or 209 includes P channel MOS transistors 401 and 402 connected in series, an N channel MOS transistor 403, a capacitor 404, and an inverter 405. In fall delay circuit 206 or 209, in response to a rise of an input signal IN, capacitor 404 is discharged through one N channel MOS transistor 403, and therefore an output signal OUT quickly rises. On the other hand, in response to a fall of input signal IN, capacitor 404 is charged through two P channel MOS transistors 401 and 402, and therefore output signal OUT is delayed in falling. Note that the capacitance of capacitor 404 in fall delay circuit 206 is smaller than the capacitance of capacitor 404 in fall delay circuit 209.

Figure 5:
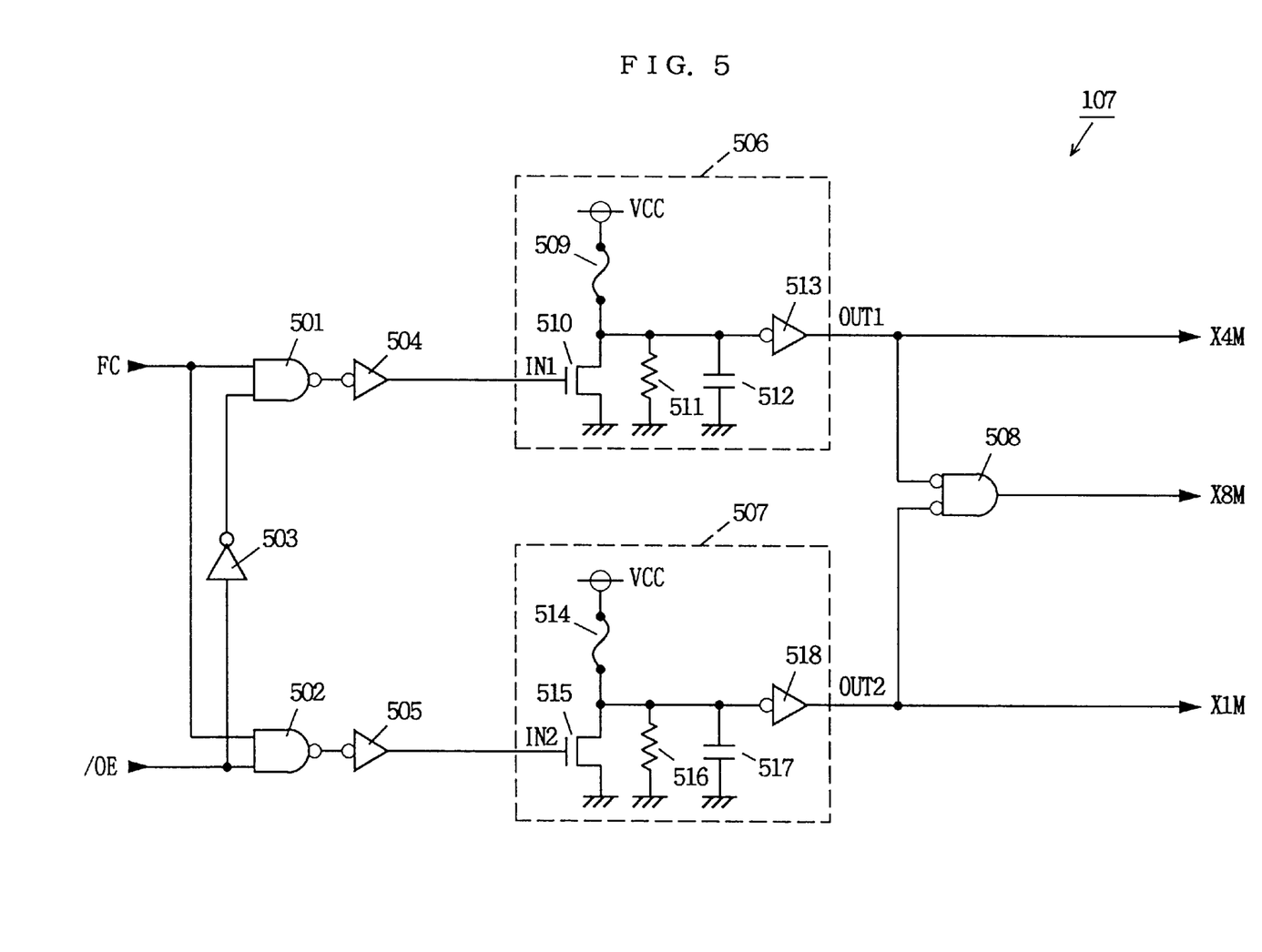
FIG. 5 is a circuit diagram showing the specific structure of a word configuration programming circuit in FIG. 1.

FIG. 5 is a circuit diagram showing the structure of word configuration programming circuit 107 in FIG. 1. Referring to FIG. 5, word configuration programming circuit 107 includes NAND circuits 501 and 502, inverters 503 to 505, programming sections 506 and 507, and an NOR circuit (negative logic) 508. NAND circuit 501 receives a programming signal FC from programming mode detecting circuit 106, an output enable signal /OE and a complementary signal OE. NAND circuit 502 receives these programming signal FC and output enable signal /OE.

Programming section 506 includes an electrically disconnectable fuse 509, an N channel MOS transistor 510 turned on/off in response to a signal IN1 from inverter 504, a pull down resistor element 511 having a high resistance, a capacitor 512 for supporting the pull down function of resistor element 511, and an inverter 513. Programming section 507 as is the case with programming section 506 includes a fuse 514, an N channel MOS transistor 515, a resistor element 516, a capacitor 517, and an inverter 518. Herein, fuses 509 and 514 are both formed of polysilicon having a sheet resistance of several tens of Q.

Inverter 513 generates a mode signal ×4M representing ×4 configuration. NOR circuit 508 receives a signal OUT1 from inverter 513 and a signal OUT2 from inverter 518 and generates a mode signal ×8M representing ×8 configuration. Inverter 518 generates a mode signal ×1M representing ×1 configuration.

The operation of semiconductor device will be now described.

(1) ×8 Configuration Mode

In an initialized state, fuses 509 and 514 shown in FIG. 5 are not disconnected. The input of inverter 513 is therefore pulled up to power supply voltage VCC, and therefore signal OUT1 from programming section 506 is at an L level. The input of inverter 518 is pulled up to power supply voltage VCC, and therefore signal OUT2 from programming section 507 is also at an L level. Herein, resistor elements 511 and 516 each have a high resistance, and therefore a through current fed through fuses 509 and 514 and resistor elements 511 and 516 can be prevented.

In an initialize state, signals OUT1 and OUT2 from programming sections 506 and 507 are both at an L level, and therefore only the mode signal ×8M is at an H level, with the other mode signals ×1M and ×4M being at an L level. Word configuration selecting circuit 108 therefore activates 8 sense amplifier/write drivers 103, 8 data input buffers 104, and 8 data output buffers 105. As a result, in response to application of one address signal formed of n bits, 8-bit data is input to memory cell array 101 at a time or 8-bit data is output from memory cell array 101 at a time. In the initialize state, ×8 configuration is selected as described above.

(2) ×1 configuration mode

Figure 6:
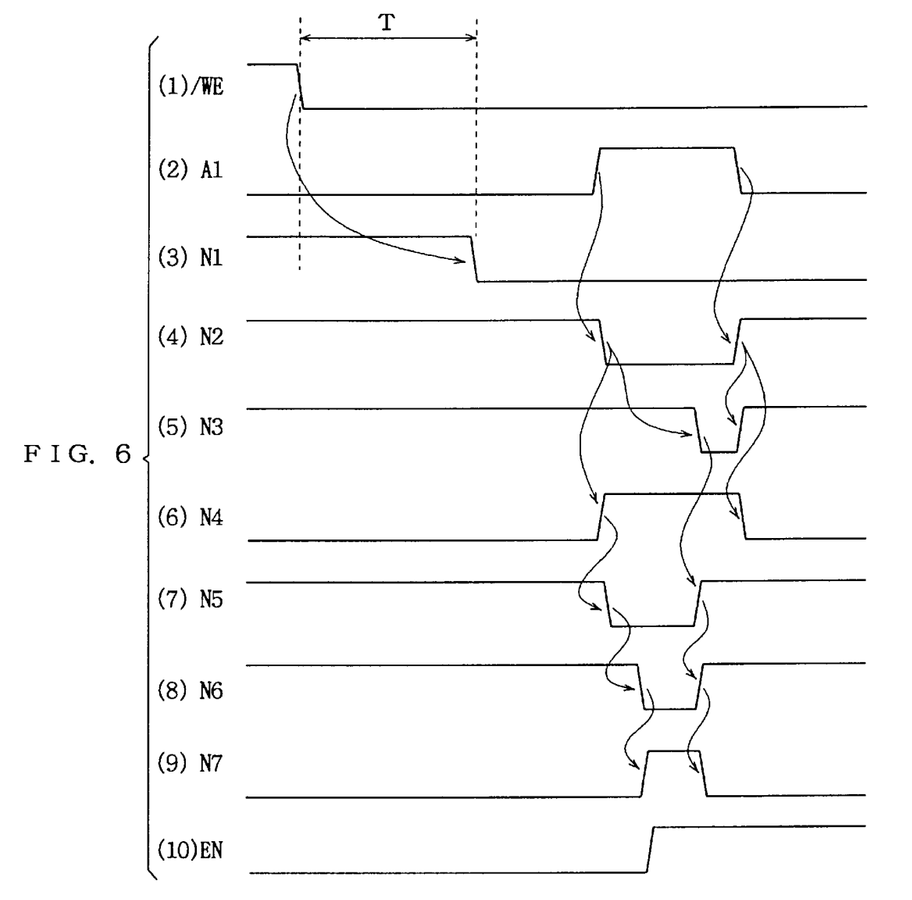
FIG. 6 is a timing chart for use in illustration of the operation of a timing detecting circuit in FIG. 2.

If the first bit A1 of an address signal changes as shown at (2) in FIG. 6 while write enable signal /WE is at an L level as shown at (1) in FIG. 6, activation signal EN from timing detecting circuit 200 in FIG. 2 attains an H level as shown at (10) in FIG. 6. Such a timing in which the address signal changes during the period of write enable signal /WE being at an L level is not usually taken. Such a timing is therefore prohibited in a usual semiconductor device. Note that the first bit A1 of the address signal is used herein, but the other bits A2 to An may be used. Any prohibited timings may be used instead of such a timing.

The operation of timing detecting circuit 200 in FIG. 2 will be now specifically described with reference to the timing chart in FIG. 6. As illustrated in FIG. 6 at (1), when write enable signal /WE attains an L level, N channel MOS transistor 202 is turned off, and capacitor 203 is charged through resistor element 201. Voltage at a node N1 attains an L level after the passage of the falling timing period T of write enable signal /WE. The time period T is determined based on the time constants of resistor element 201 and capacitor 203.

After the passage of time T since the fall of write enable signal /WE, when the first bit A1 of the address signal changes its level from L to H as shown in FIG. 6 at (2), voltage at a node N2 changes its level from H to L as shown in FIG. 6 at (4). When the first bit A1 changes its level from H to L, voltage at node N2 changes its level from L to H. Fall delay circuit 206 delays only the fall of an output signal from inverter 205 (voltage at node N2), and therefore voltage at a node N3 changes as shown in FIG. 6 at (5). NAND circuit 208 receives such voltage at node N3 and voltage at node N2 as shown in FIG. 6 at (6) and voltage at complementary node N4. The output signal of NAND circuit 208 (voltage at N5) changes as illustrated in FIG. 6 at (7). Fall delay circuit 209 delays only the fall of the output signal of NAND circuit 208 (voltage at node N5) and therefore voltage at a node N6 changes as illustrated in FIG. 6 at (8). Voltage at a node N7 attains an H level as illustrated in FIG. 6 at (9) while the voltage at node N1 is at an L level, and therefore activation signal EN attains an H level as illustrated in FIG. 6 at (10).

Voltage at node N7 thereafter attains an L level, but activation signal EN maintains the H level by the latch function of NOR circuits 211 and 212. Activation signal EN attains an L level when write enable signal /WE attains an H level and voltage at node N1 attains an H level. Thus, the programming mode is completed.

When activation signal EN attains an H level as described above, voltage comparison circuit 300 shown in FIG. 3 is activated. More specifically, N channel MOS transistor 310 is turned on, and differential sense amplifier 305 is activated. N channel MOS transistor 302 is turned on, and the fixed reference voltage Vref is generated. N channel MOS transistor 313 is turned on, and power supply detecting voltage Vpw in proportion to power supply voltage VCC is generated. Differential sense amplifier 305 compares power supply detecting voltage Vpw with reference voltage Vref, generates an output signal of an H level when power supply detecting voltage Vpw is lower than reference voltage Vref, and generates an output signal of an L level when power supply detecting voltage Vpw is higher than reference voltage Vref. Since the output signal is inverted by inverter 315, an L level programming signal FC is generated as a result if power supply detecting voltage Vpw is lower than reference voltage Vref, while an H level programming signal FC is generated if power supply detecting voltage Vpw is higher than reference voltage Vref.

Figure 7:
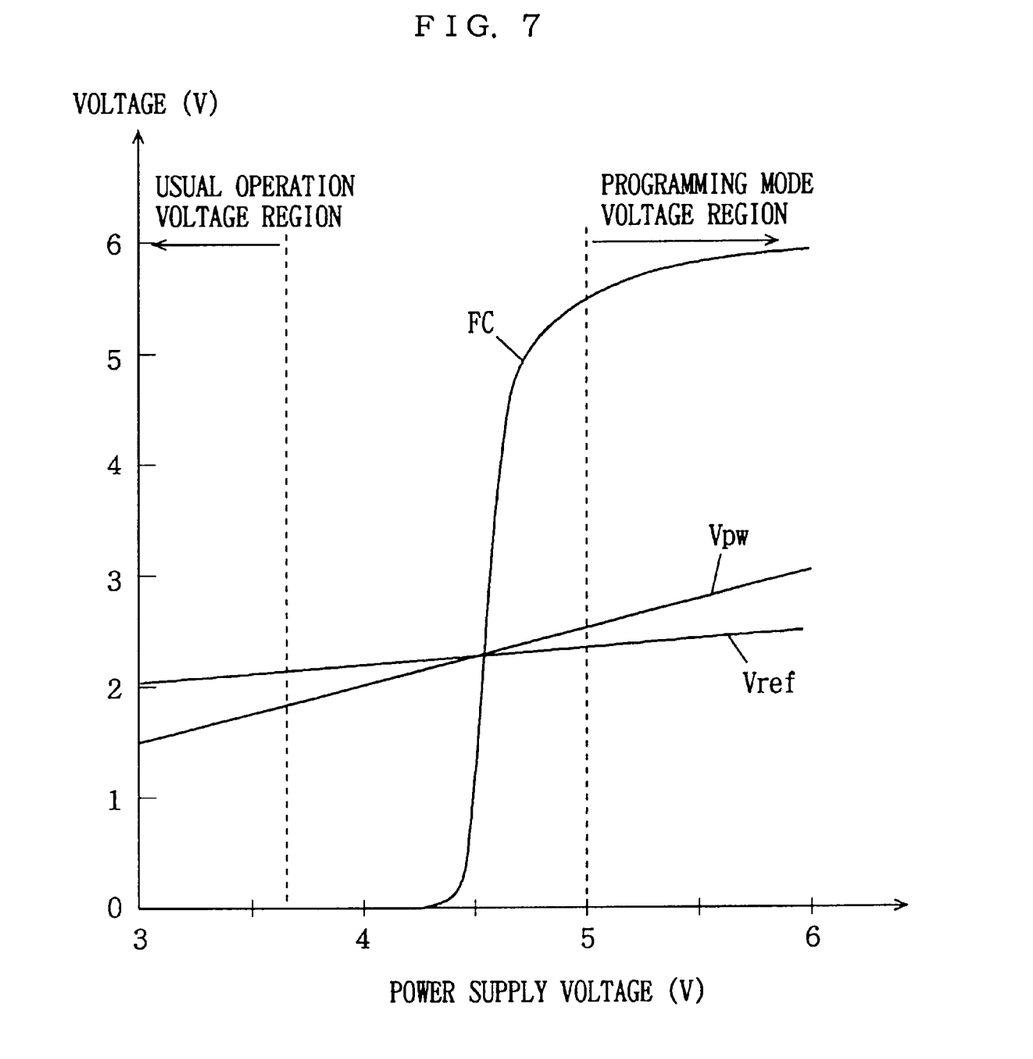
FIG. 7 is a graph for use in illustration of the operation of the voltage comparison circuit in FIG. 3.

As shown in FIG. 7, even when power supply voltage Vcc is increased reference voltage Vref is maintained at a substantially fixed level. This is because N channel MOS transistors 303 and 304 are diode-connected. Meanwhile, power supply detecting voltage Vpw rises as the power supply voltage rises. This is because power supply detecting voltage Vpw is produced by resistance dividing of the power supply voltage.

3V type semiconductor memory devices usually receive power supply voltage Vcc of 3.6V or lower for operation. N channel MOS transistors 303 and 304 and resistor elements 311 and 312 are designed so that the straight line representing the change of power supply detecting voltage Vpw crosses the straight line representing reference voltage Vref at the point of power supply voltage of 4.5V.

Power supply detecting voltage Vpw is lower than reference voltage Vref in a usual operation mode region, and therefore an L level programming signal FC is generated. Meanwhile, if power supply voltage VCC is pulled up to 5V or higher in a programming mode, whereby power supply detecting voltage Vpw becomes higher than reference voltage Vref, an H level programming signal FC is generated. When activation signal EN thus attains an H level and power supply voltage VCC is pulled to 5V or higher, voltage comparison circuit 300 supplies an H level programming signal FC to word configuration programming circuit 107 in FIG. 5.

Note that if activation signal EN is at an L level, P channel MOS transistor 314 in voltage comparison circuit 300 is turned on and therefore programming signal FC attains an L level.

In order to change the word configuration from ×8 to ×1, an H level output enable signal /OE is applied. As a result, the output signal IN2 of inverter 505 in word configuration programming circuit 107 shown in FIG. 5 attains an H level. This turns on N channel MOS transistor 515, thereby disconnecting fuse 514. The output signal OUT2 of inverter 518 attains an H level as a result, mode signal ×8M falls from H level to L level, and mode signal ×1M is pulled from L level to H level.

Word configuration selecting circuit 108 therefore activates one sense amplifier/write driver 103, one data input buffer 104, and one data output buffer 105. As a result ×1 configuration is selected.

When the semiconductor memory device returns to a usual operation mode from the programming mode, programming signal FC attains an L level, which turns off N channel MOS transistor 515, but since the input voltage of inverter 518 is pulled down to an L level by the function of resistor element 516, mode signal ×1M is maintained at an H level. However, if the resistance of resistor element 516 is too large, the input voltage of inverter 518 cannot be quickly pulled down after turning on the power supply. Capacitor 517 is connected in parallel to resistor element 516, and the input voltage of inverter 518 is quickly pulled down after turning on of the power supply by the coupling function of capacitor 517.

(3) ×4 Configuration Mode

As is the case with the ×1 configuration mode described above, when the first bit A1 of an address signal changes and power supply voltage VCC is pulled to 5V or higher while write enable signal /WE is at an L level, programming mode detecting circuit 106 generates an H level programming signal FC. In order to change the word configuration from ×8 to ×4, an L level output enable signal /OE is applied. The output signal IN1 of inverter 504 in word configuration programming circuit 107 in FIG. 5 is pulled from L level to H level. This turns on N channel MOS transistor 510, thereby disconnecting fuse 509. As a result, inverter 513 generates an H level output signal OUT1. Then, mode signal ×8M falls from H level to L level, and mode signal ×4 is pulled from L level to H level.

When mode signal ×4M thus attains an H level, word configuration selecting circuit 108 activates 4 sense amplifier/write drivers 103, 4 data input buffers 104 and 4 data output buffers 105. ×4 configuration is selected as a result.

Note that if the semiconductor memory device returns from the programming mode to the usual operation mode, mode signal ×4M is maintained at an H level.

According to the first embodiment of the invention, a word configuration can be programmed in word configuration programming circuit 107, and therefore the word configuration can be changed even after molding. The semiconductor device can be tested with ×8 configuration at the time of wafer test or final test, which reduces time required for testing. In addition, since additional pads for setting a word configuration are not necessary, the area penalty is smaller than the case of bonding option. Furthermore, the programming mode is detected by using the timing of a signal to be applied to an existing input terminal and the elevation of power supply voltage VCC, no additional input terminal is necessary for the programming mode. The above-described signal timing as well as the elevation of the power supply voltage is used for detecting the programming mode, a semiconductor memory device will not take a programming mode by mistake in response to use of such timing.

Second Embodiment

In the first embodiment described above, after ×1 configuration is selected by disconnection of fuse 514 in word configuration programming circuit 107, if the semiconductor memory device attains a programming mode by mistake, fuse 509 may possibly be disconnected as well. In such a case, not only mode signal ×1M but also mode signal ×4M attains an H level, and there is a possibility that a single one word configuration is not correctly selected. A second embodiment of the invention is therefore directed to providing a semiconductor memory device which will not be erroneously reprogrammed once a word configuration is programmed.

Figure 8:
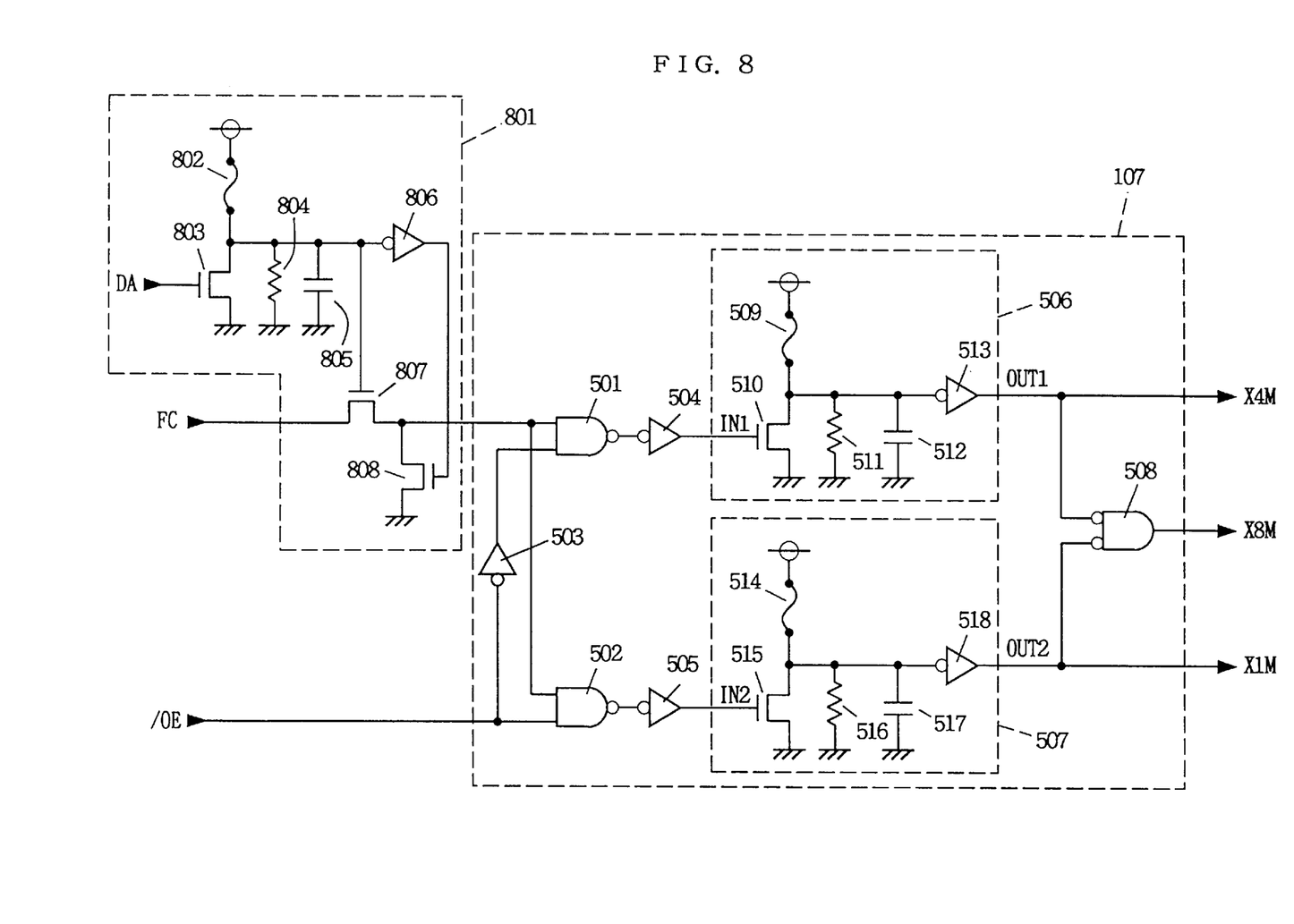
FIG. 8 is a circuit diagram showing the structures of a word configuration programming circuit and an erroneous programming preventing circuit therefor in a semiconductor memory device according to a second embodiment of the invention.

FIG. 8 is a block diagram showing the structures of an erroneous programming prevention circuit and a word configuration programming circuit in a semiconductor memory device according to the second embodiment of the invention. The structure of the word configuration programming circuit is the same as word configuration programming circuit 107 in the first embodiment, and therefore the description is not repeated here.

Referring to FIG. 8, erroneous programming prevention circuit 801 is connected between programming mode detection circuit 106 and word configuration programming circuit 107 shown in FIG. 1. Erroneous programming prevention circuit 801 includes an electrically disconnectable fuse 802, an N channel MOS transistor 803 turned on/off in response to a de-activation signal DA, a pull down resistor element 804, a capacitor 805 for supporting the pull down function of resistor element 804, an inverter 806, an N channel MOS transistor 807 for transferring/cutting off programming signal FC, and an N channel MOS transistor 808 for pulling down one input voltage of two-input NAND circuit 501 in word configuration programming circuit 107 when N channel MOS transistor 807 is off. Herein, de-activation signal DA is generated by a circuit similar to programming mode detecting circuit 106 which generates programming signal FC.

When fuse 509 or 514 in word configuration programming circuit 107 is disconnected and ×1 configuration or ×4 configuration is programmed, N channel MOS transistor 803 is turned on in response to an H level de-activation signal DA, thus disconnecting fuse 802. As a result, N channel MOS transistor 807 is always turned off and N channel MOS transistor 808 is always turned on. Therefore, if N channel MOS transistor 807 cuts off programming signal FC and programming signal FC attains an H level, inverter 504 or 505 will not generate an H level output signal IN1 or IN2. More specifically, N channel MOS transistors 510 and 515 are always turned off.

As described above, according to the second embodiment of the invention, with the provision of erroneous programming prevention circuit 801, fuse 509 or 514 will not be disconnected even if the semiconductor memory device is erroneously brought into a programming mode after a word configuration is set. Therefore, word configuration programming circuit 107 will not be erroneously reprogrammed with another word configuration.

Third Embodiment

In the first and second embodiments, a program once programmed in word configuration programming circuit 107 cannot be changed. It is therefore an object of a third embodiment to provide a semiconductor memory device in which a programmed word configuration can be changed.

Figure 9:
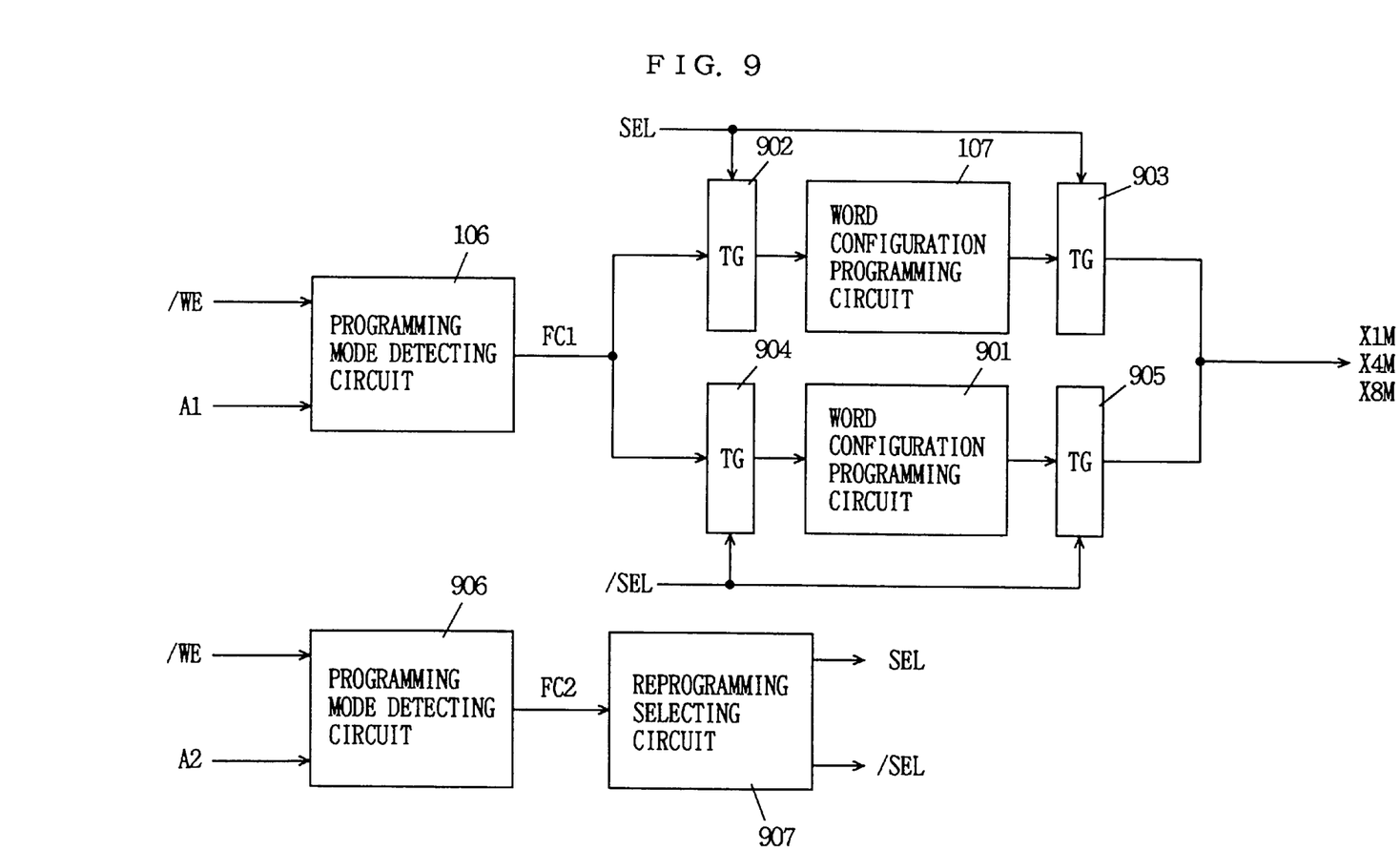
FIG. 9 is a block diagram showing the essential structure of a semiconductor memory device according to a third embodiment of the invention.

FIG. 9 is a block diagram showing the essential structure of the semiconductor memory device according to the third embodiment of the invention. Referring to FIG. 9, the semiconductor memory device includes a programming mode detecting circuit 106, two word configuration programming circuits 107 and 901, a transfer gate (TG) 902 which transfers a programming signal FC1 from programming mode detecting circuit 106 to word configuration programming circuit 107 when a select signal SEL is at an H level, a transfer gate (TG) 903 which transfers mode signals ×1M, ×4M, and ×8M from word configuration program circuit 107 to a word configuration selecting circuit (108 in FIG. 1) when select signal SEL is at an H level, a transfer gate (TG) 904 which transfers programming signal FC1 from programming mode detecting circuit 106 to word configuration programming circuit 901 when a select signal /SEL is at an H level, and a transfer gate (TG) 905 which transfers mode signals ×1M, ×4M, and ×8M from word configuration programming circuit 901 to the word configuration selecting circuit when select signal /SEL is at an H level.

The semiconductor memory device further includes a programming mode detecting circuit 906, and a reprogramming selecting circuit 907 for generating select signals SEL and /SEL in response to a programming signal FC2 from programming mode detecting circuit 906.

As is the case with the first embodiment described above, programming mode detecting circuit 106 generates an H level programming signal FC1 in response to a change of the first bit A1 of an address signal while write enable signal /WE is at an L level. Word configuration programming circuits 107 and 901 can each be programmed with one word configuration in the same manner as the first and second embodiments.

Although programming mode detecting circuit 906 has the same structure as programming mode detecting circuit 109, it generates an H level programming signal FC2 in response to a change of the second bit A2 of an address signal while write enable signal /WE is at an L level unlike programming mode detecting circuit 106.

Figure 10:
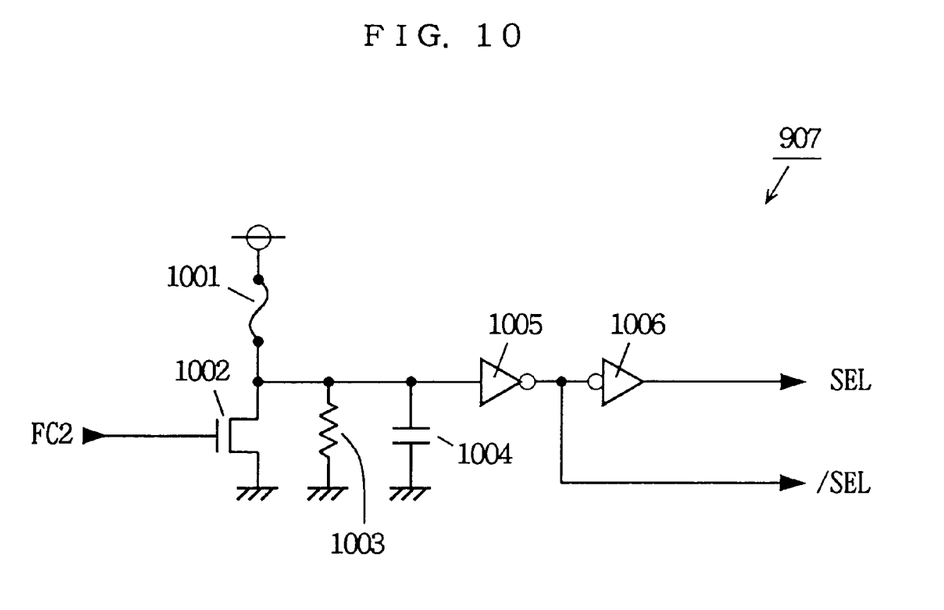
FIG. 10 is a circuit diagram showing the specific structure of a reprogramming selecting circuit in FIG. 9.

FIG. 10 is a circuit diagram showing the specific structure of reprogramming selecting circuit 907. Referring to FIG. 10, reprogramming selecting circuit 907 includes an electrically disconnectable fuse 1001, an N channel MOS transistor 1002 turned on/off in response to programming signal FC2, a pull down resistor element 1003, a capacitor 1004 for supporting the pull down function of resistor element 1003, and inverters 1005 and 1006. When a word configuration is initially programmed, fuse 1001 is not yet disconnected, therefore an H level select signal SEL is generated, and an L level select signal /SEL is generated. As a result, transfers gates 902 and 903 are turned on, but transfer gates 904 and 905 are turned off.

H level programming signal FC1 is therefore transferred only to word configuration programming circuit 107, and the first word configuration is programmed in word configuration programming circuit 107. The word configuration selecting circuit (108 in FIG. 1) therefore selects the programmed word configuration in response to mode signals ×1M ×4M, or ×8M from word configuration programming circuit 107.

In order to change the programmed word configuration, the second bit A2 of an address signal is changed while write enable signal /WE is still at an L level. Programming mode detecting circuit 906 therefore supplies H level programming signal FC2 to reprogramming selecting circuit 907. N channel MOS transistor 1002 in reprogramming selecting circuit 907 is turned on in response to the H level programming signal FC2, and fuse 1001 is disconnected. As a result, select signal SEL attains an L level, and select signal ISEL attains an H level.

Therefore, transfer gates 902 and 903 are turned off, while transfer gates 904 and 905 are turned on. H level programming signal FC1 is transferred only to word configuration programming circuit 901 through transfer gate 904. The second word configuration is programmed in word configuration programming circuit 901 in response to the H level programming signal FC1. Mode signal ×1M, ×4M or ×8M from word configuration programming circuit 901 is transferred to word configuration selecting circuit (108 in FIG. 1) through transfer gate 905. As a result, the word configuration selecting circuit selects the word configuration programmed in word configuration programming circuit 901.

As described above, with the provision of these two word configuration programming circuits 107 and 901 which are used in turn, one word configuration is programmed and then another word configuration can be reprogrammed. More specifically, the once programmed word configuration can be changed.

Note that although the word configuration can be programmed only twice according to the third embodiment, if a number of word configuration programming circuits are provided, the word configuration can be programmed the number of times equal to the number of the word configuration programming circuits provided.

Although the preferred embodiments of the invention have been specifically described, the scope of the invention should not be limited to the embodiments described above. For example, although write enable signal /WE and a single bit H of an address signal are used in order to detect a programming mode, other signals may be used. If an additional terminal can be provided, programming signal FC may be externally applied to the word configuration programming circuit through such a terminal.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:

a memory cell array;

input/output means for inputting/outputting data to/from said memory cell array;

word configuration programming means which can be programmed with a word configuration to set one of a plurality of data word bit lengths;

word configuration selecting means responsive to the word configuration programmed in said word configuration programming means for selecting the number of bits of data which said input/output means inputs/outputs simultaneously in response to address signals; and programming mode detecting means for detecting a programming mode in order to program said word configuration in said word configuration programming means and generating a programming signal, said word configuration being programmed in said word configuration programming means in response to said programming signal.

2. The semiconductor memory device as recited in claim 1, wherein said programming mode detecting means includes timing detecting means for generating an activation signal in response to application of a prescribed external signal in a prescribed timing, and voltage comparison means activated in response to said activation signal comparing a supplied power supply voltage with a prescribed voltage and for generating said programming signal when the supplied power supply voltage is higher than the prescribed voltage.

3. The semiconductor memory device as recited in claim 1, wherein said word configuration programming means includes a fuse disconnectable in response to said programming signal.

4. The semiconductor memory device as recited in claim 1, further comprising programming prohibition means for prohibiting said word configuration programming means from being programmed.

5. A semiconductor memory device, comprising:

a memory cell array;

input/output means for inputting/outputting data to/from said memory cell array;

a plurality of word configuration programming means which can be programmed with a word configuration to set one of a plurality of data word bit lengths;

activation means for selectively activating said plurality of word configuration programming means; and word configuration selecting means responsive to the word configuration programmed in said word configuration programming means activated by said activation means for selecting the bit number of data which said input/output means simultaneously inputs/outputs in response to address signals.

* * * * *